United States Patent
Popelar et al.

(10) Patent No.: US 9,209,138 B2
(45) Date of Patent: Dec. 8, 2015

(54) INTEGRATED CIRCUIT SHIELDING TECHNIQUE UTILIZING STACKED DIE TECHNOLOGY INCORPORATING TOP AND BOTTOM NICKEL-IRON ALLOY SHIELDS HAVING A LOW COEFFICIENT OF THERMAL EXPANSION

(71) Applicant: Aeroflex Colorado Springs, Inc., Colorado Springs, CO (US)

(72) Inventors: Scott Popelar, Colorado Springs, CO (US); Matthew Von Thun, Colorado Springs, CO (US); Richard Jadomski, Coloado Springs, CO (US); Karen Jackson, Colorado Springs, CO (US)

(73) Assignee: Aeroflex Colorado Springs, Inc., Colorado Springs, CO (US)

( * ) Notice: Subject to any disclaimer, the term of this patent is extended or adjusted under 35 U.S.C. 154(b) by 0 days.

(21) Appl. No.: 14/101,072

(22) Filed: Dec. 9, 2013

(65) Prior Publication Data

US 2015/0162283 A1    Jun. 11, 2015

(51) Int. Cl.
*H01L 23/552* (2006.01)
*H01L 27/22* (2006.01)
*H01L 23/10* (2006.01)
*H01L 43/02* (2006.01)

(52) U.S. Cl.
CPC .............. *H01L 23/552* (2013.01); *H01L 23/10* (2013.01); *H01L 27/222* (2013.01); *H01L 43/02* (2013.01); *H01L 2224/48091* (2013.01); *H01L 2224/73265* (2013.01); *H01L 2224/8592* (2013.01); *H01L 2924/0002* (2013.01)

(58) Field of Classification Search
CPC .............. H01L 23/552; H01L 29/3025; H01L 29/01079; H01L 29/01078; H01L 29/14
USPC ......................................... 257/659, 704, 660
See application file for complete search history.

(56) References Cited

U.S. PATENT DOCUMENTS

| | | | | |
|---|---|---|---|---|
| 5,998,867 | A * | 12/1999 | Jensen et al. | 257/729 |
| 7,382,043 | B2 * | 6/2008 | Longden et al. | 257/660 |
| 8,094,434 | B2 * | 1/2012 | Rawal et al. | 361/538 |
| 8,415,775 | B2 * | 4/2013 | Katti | 257/659 |
| 2013/0056258 | A1 * | 3/2013 | Zhang et al. | 174/388 |

* cited by examiner

*Primary Examiner* — Quoc Hoang
(74) *Attorney, Agent, or Firm* — Peter J. Meza; Hogan Lovells US LLP

(57) ABSTRACT

An integrated circuit shielding technique utilizing stacked die technology incorporating top and bottom nickel-iron alloy shields having a low coefficient of thermal expansion of especial utility in conjunction with magnetoresistive random access memory (MRAM) and other devices requiring magnetic shielding.

21 Claims, 3 Drawing Sheets

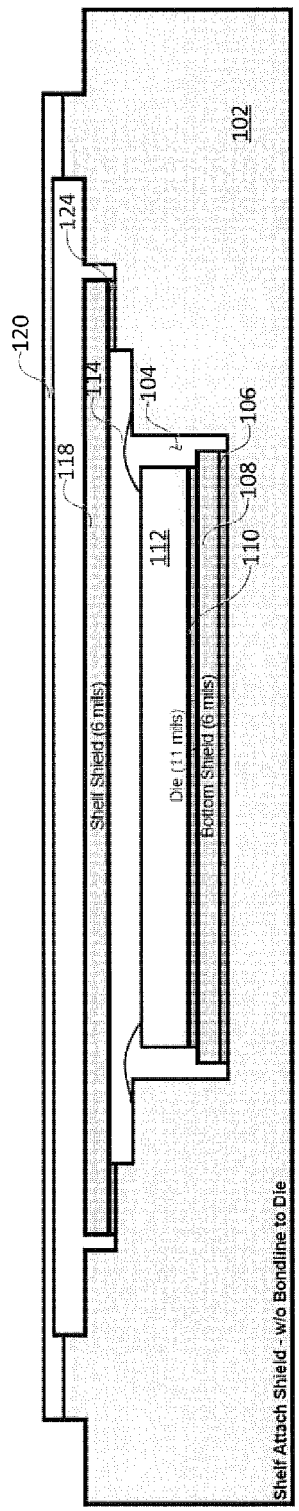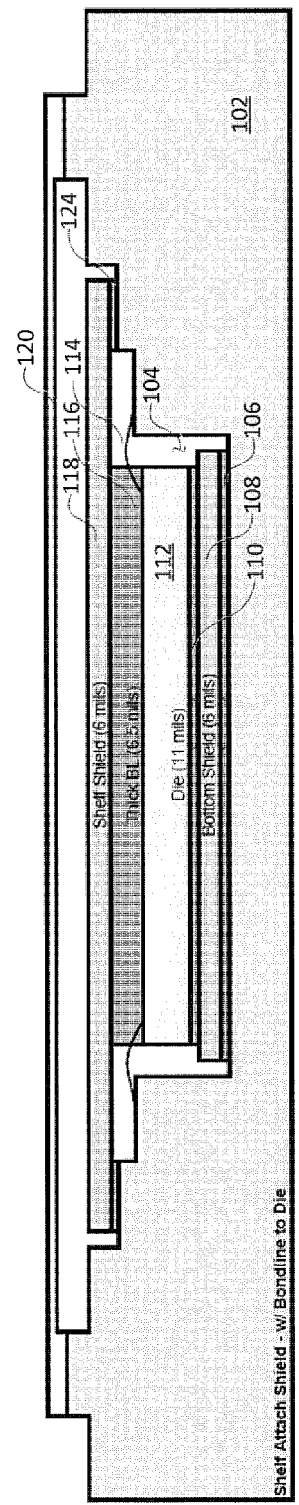

INTEGRATED CIRCUIT SHIELDING TECHNIQUE UTILIZING STACKED DIE TECHNOLOGY INCORPORATING TOP AND BOTTOM NICKEL-IRON ALLOY SHIELDS HAVING A LOW COEFFICIENT OF THERMAL EXPANSION

BACKGROUND OF THE INVENTION

The present invention relates, in general, to the field of integrated circuit devices and processes for manufacturing the same. More particularly, the present invention relates to an integrated circuit shielding technique utilizing stacked die technology incorporating top and bottom nickel-iron alloy shields having a low coefficient of thermal expansion of especial utility in conjunction with magnetoresistive random access memory (MRAM) and other devices requiring magnetic shielding.

Aeroflex Colorado Springs, assignee of the present invention, is a supplier of Qualified Manufacturers List (QML) MRAM products for high reliability aerospace applications including radiation hardened MRAM die in conjunction with the development of hermetic package technology required to assemble MRAM die into QML qualified packages.

Data in MRAM devices is not stored as an electric charge, as is the case with dynamic random access memory (DRAM) devices, but through the use of bits comprising magnetic tunnel junctions (MTJ). MTJ MRAM is made up of magnetic storage elements comprising a pair of magnetic layers separated by an oxide tunnel barrier, each of which can hold a magnetic field. In operation, one of the magnetic layers is set to a given polarity while the other's field can be changed to that of an external field to store data. Since MRAM data bits can be switched in response to magnetic fields on the order of 5 gauss, they are inherently sensitive to stray magnetic fields which can deleteriously impact performance if the device is left unshielded.

SUMMARY OF THE INVENTION

Disclosed herein is an integrated circuit shielding technique utilizing stacked die technology incorporating top and bottom nickel-iron alloy shields having a low coefficient of thermal expansion which addresses at least three main technology requirements for shielding and packaging MRAM devices for QML applications, namely reliability, hermeticity and shielding performance.

As to the first requirement, a ceramic stacked die package assembly technology is disclosed that enables the assembly of a bottom shield/MRAM Die/top shield stack. This stack technology utilizes a low outgassing epoxy die attach material with demonstrated levels of reliability sufficient for QML applications, as defined by MIL-PRF-38535 and MIL-STD-883.

In this regard, the MIL-PRF-38535 standard is a United States military specification that establishes the general performance and verification requirements of single die integrated circuit device type electronics. The MIL-STD-883 standard establishes uniform methods, controls, and procedures for testing microelectronic devices suitable for use within Military and Aerospace electronic systems including basic environmental tests to determine resistance to deleterious effects of natural elements and conditions surrounding military and space operations; mechanical and electrical tests; workmanship and training procedures; and such other controls and constraints as have been deemed necessary to ensure a uniform level of quality and reliability suitable to the intended applications of those devices.

As to hermeticity, a representative technique of the present invention disclosed herein utilizes a Kovar® (trademark of Carpenter Technology Corporation) lid and seam seal lid attach process to achieve a hermetic package, while keeping processing temperatures sufficiently low so as not to affect device performance. With respect to shielding performance, this is effectuated through the provision of top and bottom shields comprising a high permeability, high saturation ferromagnetic material, such as Invar. Additional shielding is realized through the use of the Kovar lid. Combined, the shielding performance is sufficient to maintain the integrity of the MRAM and other integrated circuit device performance.

Among the benefits and aspects of the present invention disclosed herein are the use of a low coefficient of thermal expansion (CTE), high permeability, high saturation ferromagnetic material, such as Invar, for magnetic shields. Invar has a CTE of ~2 ppm/° C., which is a close match to silicon (~3 ppm/° C.), and is much lower than other shielding materials such as MuMetal (~12 ppm/° C.). The result is a shield/die/shield stack that mitigates the effects of CTE mismatch, and provides a high level of reliability sufficient for QML applications. Further, Invar possesses high permeability and saturation shielding properties that provide a high level of magnetic shielding sufficient for MRAM applications.

Among the features of specific embodiments of the invention disclosed herein is the use of both top and bottom magnetic shields, directly attached to the die. This configuration provides maximum shielding compared to top or bottom shields only, or compared to top and bottom shields attached to the exterior of the package as opposed to the die.

Also disclosed herein is the use of magnetic shields which are the same size as the die. This enables the use of package cavity design rules based on the die size (and not bottom shield size), ensuring wirebond wire lengths meet requirements for QML applications. This also provides maximum shielding from the top shield compared to a top shield that is attached inside the wirebond pads (i.e., top shield is smaller in size than the die) while also providing sufficient clearance for wirebond escape without shorting compared to a top shield that is larger than the die size. Additionally, this configuration allows for the use of a thick bondline for the top shield attachment by increasing the amount of shielding effectiveness compared to a smaller top shield attached within the wirebond pads using a thin bondline.

In accordance with specific embodiments of the present invention disclosed herein, there is provided a technique which enables the escaping of wirebonds through a thick bondline. The use of a thick bondline for top shield attachment allows for wirebond escape through the bondline without shorting to the top shield which obviates the requirement of a spacer for stacking the shield on top of the die and allows for a shield size the same as the die size. By allowing for a top shield to be the same size as the die size, and attached directly to the die, maximum shielding is realized compared to top shields which are smaller than the die size.

Still further disclosed is the provision of a relatively thick bondline used for the top shield attachment which prevents damage to the active side of die due to the presence of silica filler particles. These filler particles are typically on the order of 1 to 2 mils in diameter and can damage the active side of die if a thin bondline were to be used for the top shield attach.

The technique of the present invention disclosed herein also allows for compatibility with hermetic ceramic package technology. The material set, shield design and assembly technology is compatible with hermetic lid attach technology which is a requirement for QML applications.

Representative embodiments of the present invention incorporate the use of a Kovar lid for magnetic shielding purposes. The Kovar lid material complements the top and bottom shields and provides additional shielding in terms of saturation and may be shaped to recess into the cavity, bringing it into closer proximity to the die, in turn providing enhanced magnetic shielding. In accordance with an exemplary implementation of the present invention, the use of multiple materials, with different permeability properties provides for enhanced magnetic shielding. In practice, the combined effect of using Invar and Kovar materials for the shields and lid respectively provides optimum magnetic shielding characteristics for the package technology shielding technique disclosed herein and has been found to be preferable to the use of either alone in providing shielding for MRAM devices.

Particularly disclosed herein is an integrated circuit device which comprises a device package having a cavity in an upper surface thereof and a first shield member overlying the device package within the cavity. An integrated circuit die overlies the first shield and a second shield member overlies the integrated circuit die. A lid overlies the second shield member and is displaced therefrom with the lid being attached to the device package laterally of the cavity.

Also particularly disclosed herein is a method for forming an integrated circuit device which comprises: providing a device package having a cavity in an upper surface thereof, bonding a first shield member overlying the device package within the cavity, also bonding an integrated circuit die overlying the first shield, further bonding a second shield member overlying the integrated circuit die and attaching a lid to the device package laterally of the cavity overlying the second shield member and displaced therefrom.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 3A is still another partial, cross-sectional view of an integrated circuit device in accordance with still another representative implementation of the shielding technique of the present invention illustrative of the top shield being supported by a shelf formed in the device package and without a bondline to the die itself; and FIG. 3B is an additional partial, cross-sectional view of an integrated circuit device in accordance with an additional representative implementation of the shielding technique of the present invention illustrative of the top shield being supported by a shelf formed in the device package and further incorporating a relatively thick bondline to the die itself.

DESCRIPTION OF A REPRESENTATIVE EMBODIMENT

Figure 1A:
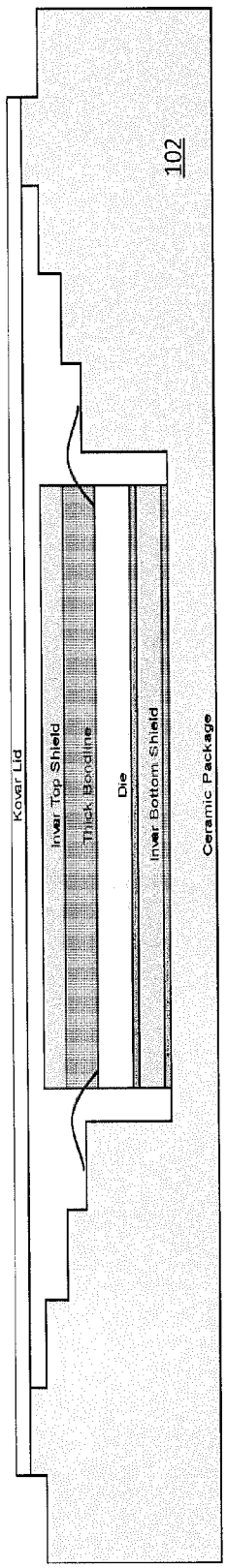
FIG. 1A is a partial, cross-sectional view of an integrated circuit device in accordance with a particular representative implementation of the shielding technique of the present invention illustrative of the top and bottom shields in conjunction with a nickel-cobalt ferrous alloy lid.

With reference now to FIG. 1A, a partial, cross-sectional view of an integrated circuit device in accordance with a particular representative implementation of the shielding technique of the present invention is shown illustrative of the top and bottom shields in conjunction with a nickel-cobalt ferrous alloy lid. In this representative embodiment of the present invention, an integrated circuit device 100A is shown as a die mounted within a recess, or cavity, in a ceramic device package 102.

Figure 1B:
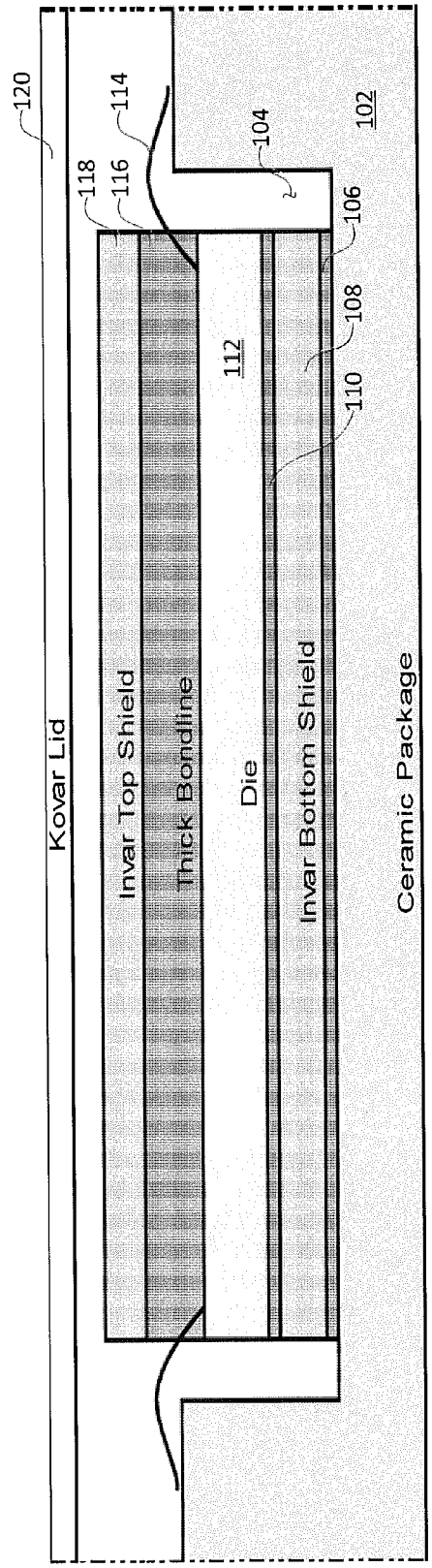
FIG. 1B is a more detailed and enlarged view of a portion of the integrated circuit device of the preceding figure further illustrative of the top and bottom shields being substantially equal in size and coextensive with the integrated circuit die.

With reference additionally now to FIG. 1B, a more detailed and enlarged view of a portion of the integrated circuit device 100A of the preceding figure is shown further illustrative of the top and bottom shields being substantially equal in size and coextensive with the integrated circuit die. In this more detailed view, the integrated circuit device 100A is shown as comprising, for example, a ceramic device package 102 presenting a recess, or cavity 104.

A thin bondline 106 is formed within the cavity 104 over which is placed a bottom shield 108 which comprises a nickel-iron alloy having a low coefficient of thermal expansion. In a representative embodiment of the present invention, the bottom shield 108 may comprise Invar which is a high permeability, high saturation ferromagnetic material which is also known generically as $FeNi_{36}$ and is known for its particularly low coefficient of thermal expansion (CTE or $\alpha$).

The bottom shield 108 is overlaid with another thin bondline 110 on which the integrated circuit die 112 is positioned and wirebonds 114 attached with a relatively thick bondline 116 then overlying the die 112.

A top shield 118 then overlies the relatively thick bondline 116 and may also be formed of Invar as the bottom shield 108. A lid 120, which in the representative embodiment of the integrated circuit device 100A may comprise Kovar, is positioned in an overlying relationship to the top shield 118 and is supported by, and affixed to, the device package 102 as more clearly illustrated in FIG. 1A to provide a hermetic seal.

With respect to the integrated circuit device 100A illustrated, relatively thin bondlines 106, 110 of ~2.0 mils may be utilized for the bottom shield 108 and die 112 attach. In comparison, a relatively thick bondline 116 of ~10.0 mils may be used for the top shield 118 attach which allows for the wirebond 114 escape through the attachment material while providing sufficient clearance to the top shield 118 to preclude shorting. The thick bondline 116 also serves to prevent damage to the die 112 due to the presence of silica filler particles.

With respect to the relatively thin bondlines 106, 110 and the relatively thick bondline 116, a low outgassing epoxy die attach material such as Ablestik Ablebond 8700K (available from Henkel Corporation) may be used. It should be noted that in the representative embodiment of the present invention comprising integrated circuit device 100A, both the top and bottom shields 118, 108 are the same size and substantially the same size as the die 112.

Figure 2A:
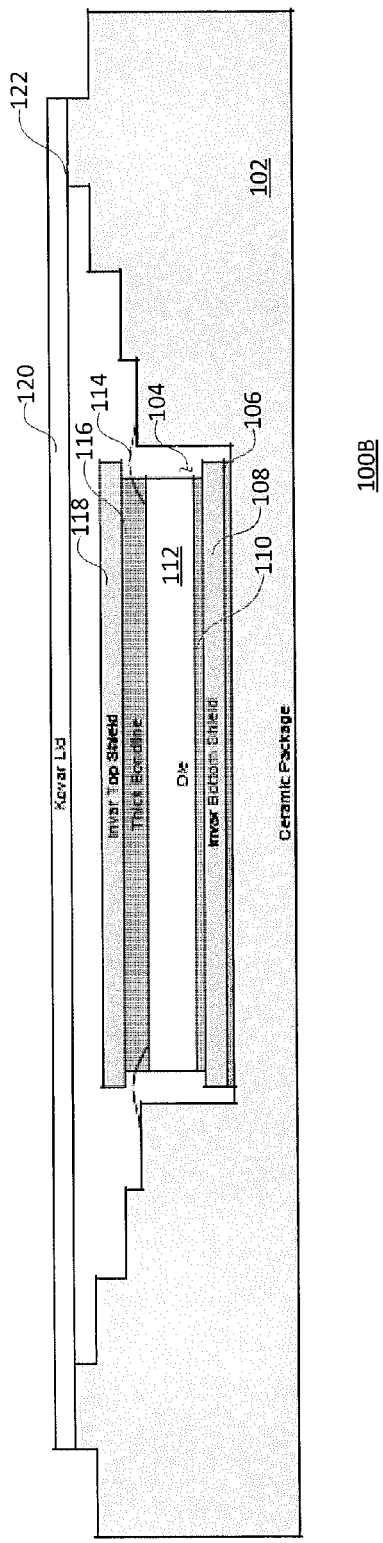
FIG. 2A is another partial, cross-sectional view of an integrated circuit device in accordance with another representative implementation of the shielding technique of the present invention illustrative of the top and bottom shields being substantially equal in size and extending beyond the perimeter of the integrated circuit die.

With reference additionally now to FIG. 2A, another partial, cross-sectional view of an integrated circuit device 100B in accordance with another representative implementation of the shielding technique of the present invention is shown illustrative of the top and bottom shields 118, 108 being substantially equal in size and extending beyond the perimeter of the integrated circuit die 112. Like structure to that previously shown and described with respect to the preceding figures is like numbered and the foregoing description shall suffice herefor.

Figure 2B:
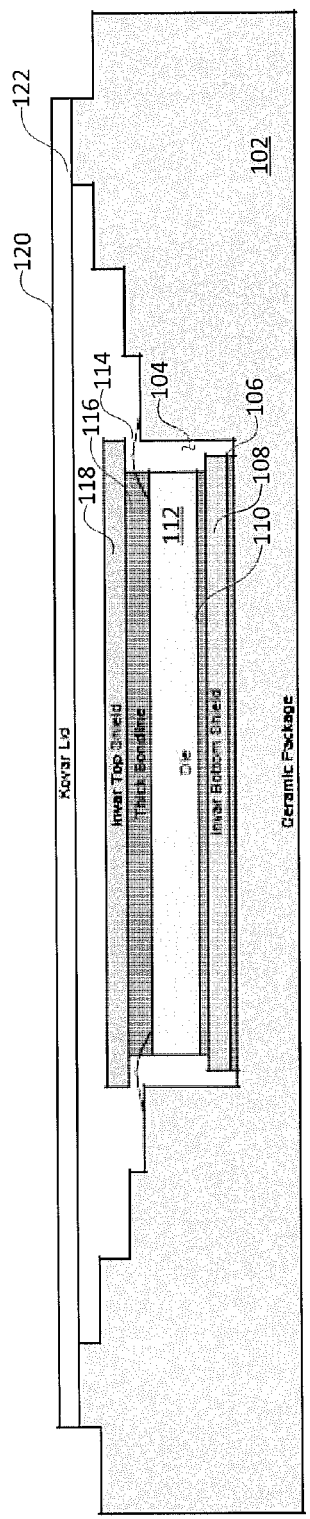
FIG. 2B is yet another partial, cross-sectional view of an integrated circuit device in accordance with yet another representative implementation of the shielding technique of the present invention illustrative of the top shield being larger than the bottom shield in size.

With reference additionally now to FIG. 2B, yet another partial, cross-sectional view of an integrated circuit device 100C in accordance with yet another representative implementation of the shielding technique of the present invention is shown illustrative of the top shield 118 being larger in size than the bottom shield 108. Again, like structure to that previously shown and described with respect to the preceding figures is like numbered and the foregoing description shall suffice herefor.

With reference additionally now to FIG. 3A, still another partial, cross-sectional view of an integrated circuit device 100D in accordance with still another representative implementation of the shielding technique of the present invention is shown illustrative of the top shield 118 being supported by a shelf formed in the device package 102 and without a bondline to the die 112 itself. Once again, like structure to that previously shown and described with respect to the preceding figures is like numbered and the foregoing description shall suffice herefor. As illustrated, the top shield 118 in this embodiment is bonded to corresponding shelves formed in the die package 102 by additional relatively thin bondlines 124. The top shield 118 (or shelf shield in this embodiment) will have dimensions sufficient to enable its bonding through relatively thin bondlines 124 to the corresponding shelves of die package 102.

With reference additionally now to FIG. 3B, an additional partial, cross-sectional view of an integrated circuit device 100E in accordance with an additional representative implementation of the shielding technique of the present invention is shown illustrative of the top shield 118 being supported by a shelf formed in the device package 102 and further incorporating a relatively thick bondline 116 to the die 112 itself. As before, like structure to that previously shown and described with respect to the preceding figures is like numbered and the foregoing description shall suffice herefor.

In this particular embodiment of the present invention the top shield 118 is bonded to corresponding shelves formed in the die package 102 by additional relatively thin bondlines 124 as in the embodiment of FIG. 3A. Additionally, the top shield 118 has a relatively thick bondline 116 attachment to the die 112. The top shield 118 (or shelf shield in this embodiment) will also have dimensions sufficient to enable its bonding through relatively thin bondlines 124 to the corresponding shelves of die package 102.

While there have been described above the principles of the present invention in conjunction with specific device structures and processing, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. An integrated circuit device comprising:
   a device package having a cavity in an upper surface thereof;
   a substantially planar first shield member overlying said device package within said cavity;
   an integrated circuit die overlying said first shield;
   a substantially planar second shield member overlying said integrated circuit die;
   a lid overlying said second shield member and displaced therefrom, said lid being attached to said device package laterally of said cavity; and
   a first bondline for directly coupling said device package to said first shield member.

2. The integrated circuit device of claim 1 wherein said device package comprises a ceramic.

3. The integrated circuit device of claim 1 wherein the first bondline comprises a relatively thin bondline of substantially 2.0 mils interposed between said device package and said first shield member.

4. The integrated circuit device of claim 3 wherein said first bondline comprises a low outaassing epoxy die attach material.

5. The integrated circuit device of claim 1 wherein said first shield member comprises a high permeability, high saturation ferromagnetic material having a low coefficient of thermal expansion.

6. The integrated circuit device of claim 5 wherein said ferroelectric material comprises Invar.

7. The integrated circuit device of claim 1 further comprising a second bondline comprising a relatively thin bondline of substantially 2.0 mils interposed between said first shield member and said integrated circuit die.

8. The integrated circuit device of claim 7 wherein said second bondline comprises a low outgassing epoxy die attach material.

9. The integrated circuit device of claim 1 wherein said integrated circuit die comprises an MRAM device.

10. The integrated circuit device of claim 1 further comprising a third bondline comprising a relatively thick bondline of substantially 10.0 mils interposed between said integrated circuit die and said second shield member.

11. The integrated circuit device of claim 10 wherein said second shield member is attached to said device package laterally of said cavity and medially of said lid.

12. The integrated circuit device of claim 10 further comprising wirebond extending from said integrated circuit device and through said third bondline.

13. The integrated circuit device of claim 10 wherein said third bondline comprises a low outgassing epoxy die attach material.

14. The integrated circuit device of claim 1 wherein said lid comprises a controlled expansion nickel-cobalt ferrous alloy.

15. The integrated circuit device of claim 14 wherein said alloy comprises Kovar®.

16. The integrated circuit device of claim 1 wherein said first and second shield members are substantially the same size.

17. The integrated circuit device of claim 16 wherein said first and second shield members are substantially the same size as said integrated circuit die.

18. The integrated circuit device of claim 16 wherein said first and second shield members are larger than said integrated circuit die.

19. The integrated circuit device of claim 1 wherein said second shield member is attached to said device package laterally of said cavity and medially of said lid.

20. The integrated circuit device of claim 1 further comprising wirebonds extending from said integrated circuit die.

21. The integrated circuit device of claim 1 wherein said second shield member is larger than said first shield member.

* * * * *